(12) United States Patent
Becher et al.

(10) Patent No.: US 7,174,483 B2
(45) Date of Patent: Feb. 6, 2007

(54) METHOD FOR OPERATING A PROCESSOR-CONTROLLED SYSTEM

(75) Inventors: Alwin Becher, Fuerth (DE); Peter Bertelshofer, Zirndorf (DE); Roger Pohlmann, Nuremberg (DE)

(73) Assignee: Conti Temic microelectronic GmbH, Nuremberg (DE)

(*) Notice: Subject to any disclaimer, the term of this patent is extended or adjusted under 35 U.S.C. 154(b) by 641 days.

(21) Appl. No.: 10/398,544

(22) PCT Filed: Oct. 2, 2001

(86) PCT No.: PCT/EP01/11365

§ 371 (c)(1),
(2), (4) Date: Apr. 7, 2003

(87) PCT Pub. No.: WO02/33549

PCT Pub. Date: Apr. 25, 2002

(65) Prior Publication Data

US 2004/0078731 A1    Apr. 22, 2004

(30) Foreign Application Priority Data

Oct. 6, 2000    (DE)    ................. 100 49 441

(51) Int. Cl.
*G06F 11/00* (2006.01)
(52) U.S. Cl. .............. 714/55; 714/23; 714/30; 714/51
(58) Field of Classification Search ........... 714/23, 714/30, 51, 55
See application file for complete search history.

(56) References Cited

U.S. PATENT DOCUMENTS

| 4,488,303 | A |   | 12/1984 | Abramovich |
| 4,956,807 | A |   | 9/1990 | Hosaka et al. |
| 5,233,613 | A | * | 8/1993 | Allen et al. ................ 714/55 |
| 5,327,362 | A | * | 7/1994 | Nomura ...................... 714/55 |
| 5,440,725 | A | * | 8/1995 | Weller et al. ............... 714/55 |
| 6,076,172 | A |   | 6/2000 | Kimura et al. |
| 6,243,837 | B1 | * | 6/2001 | Zimmermann et al. ...... 714/55 |
| 6,393,589 | B1 | * | 5/2002 | Smit et al. ................... 714/55 |
| 6,490,699 | B2 | * | 12/2002 | Nishibe et al. .............. 714/55 |

FOREIGN PATENT DOCUMENTS

DE    3345863    7/1984

OTHER PUBLICATIONS

M. Namjoo; "Techniques For Concurrent Testing of VLSI Processor Operation"; Center For Reliable Computing, Departments of Electrical Engineering and Computer Science, Stanford University, Stanford, CA, ; 1982 IEEE TEST Conference (Nov. 1982); Paper 16.2, pp. 461 to 468.

* cited by examiner

*Primary Examiner*—Robert Beausoliel
*Assistant Examiner*—Joseph D. Manoskey
(74) *Attorney, Agent, or Firm*—W. F. Fasse; W. G. Fasse

(57) ABSTRACT

A method for monitoring a system controlled by a processor utilizes an integrated monitoring unit independent of the processor but integrated together with the processor in an integrated circuit, as well as a watchdog unit for preventing measures that influence the system. The watchdog unit is cyclically reset by the integrated monitoring unit.

10 Claims, 2 Drawing Sheets

METHOD FOR OPERATING A PROCESSOR-CONTROLLED SYSTEM

FIELD OF THE INVENTION

The invention relates to a method for operating a system controlled by a processor.

BACKGROUND INFORMATION

Processor-controlled systems, for example systems controlled by microprocessors or microcontrollers, are especially used for realizing particular applications, for example for realizing prescribed functions or process sequences. Through an error in the system, for example, through a malfunction in the processor or a bit error in a memory unit of the system, an application error can arise, for example an erroneous process sequence or an unintended function can be realized and carried out. This erroneous behavior or malfunction is undesired and interfering, and must be excluded or prevented especially in processor-controlled systems for realizing safety critical applications (in motor vehicles for example the applications relating to the cruise control, the airbag, or the steering angle recognition, or control devices influencing the motor of the motor vehicle).

In order to recognize and/or exclude erroneous behaviors or malfunctions of the system, especially in safety critical applications, the processor can be monitored by an external monitoring unit, especially by an external monitoring computer or an external application specific circuit (ASIC); the system is reset, or switched to be non-functional, or switched into a secure condition, if a malfunction of the processor is recognized by the external monitoring unit. In this regard, the difficulties in the synchronization of the processor and the external monitoring unit, the problems that are possible in the communication between the processor and the external monitoring unit, especially potential EMC interferences on the connecting lines between the processor and the external monitoring unit, the additional costs for the external monitoring unit as well as the expenditures and efforts for hardware, development and programming of the external monitoring unit, are all disadvantageous.

SUMMARY OF THE INVENTION

It is the underlying object of the invention to present a method for operating a system controlled by a processor, in which the correct operation of the system, especially for safety critical applications, can be reliably monitored in a simple and economical manner.

This object is achieved according to the invention in a method for operating a system controlled by a processor, having features as described and claimed herein.

The processor provided for the control of the system, for example a processor realizing a certain function or a certain process sequence, for example a microcontroller implemented in a control device, is monitored with respect to its functional manner of operation by a monitoring unit that is operated independently of the processor and that is integrated with the processor in an integrated circuit; the integrated monitoring unit, which is, for example, embodied as a computing or arithmetic logic unit independent of the processor, is coupled with the processor preferably over the lines of an internal bus system of the integrated circuit. In the initialization of the system, the integrated monitoring unit is started by the processor after checking its functionality and is operated independently of the processor starting at this point in time; that is to say the processor can no longer have any influence on the integrated monitoring unit, especially on its output or output signal, except for completely switching off the integrated monitoring unit, for example if the test of the integrated monitoring unit by the processor during the initialization phase has a negative result. The start and the switching-off of the integrated monitoring unit, that is to say the starting run-up and the ending of the monitoring of the processor by the integrated monitoring unit, and a clock shifting or offset of the clock pulse of the processor and/or the integrated monitoring unit is monitored by a watchdog unit connected with the integrated monitoring unit; this watchdog unit is provided in many processor-controlled systems (especially for realizing safety critical applications), in order to recognize undefined conditions of the system (for example endless loops in the software due to an erroneous operation code) and especially to end such an undefined condition by a resetting of the system (a reset). This watchdog unit must be cyclically reset by the integrated monitoring unit during the program running time of the processor for the permanent testing of the processor, for preventing measures having an influence on the system, especially for avoiding a resetting of the processor and therewith of the processor-controlled system; when an error arises, the watchdog unit is not reset, whereby for example, as measures having an influence on the system, either a reset of the processor and therewith of the system is forced or the system is placed out of operation or the system is brought into a secure system condition (no longer influenceable by the processor).

In this context, the watchdog unit, as an independent functional unit of the processor-controlled system, either can be similarly integrated in the integrated circuit—in this case the watchdog unit can also be connected to the internal bus system of the integrated circuit—or can be arranged outside of the integrated circuit—in this case the connection between the integrated circuit, especially between the integrated monitoring unit and the processor on the one hand as well as the watchdog unit on the other hand can be achieved via an external data line.

The communication between the processor and the integrated monitoring unit for monitoring the processor can, for example, be realized by a question-and-answer or inquiry-and-response procedure, dependent on the result of which the watchdog unit is activated by the integrated monitoring unit. For example by prescribing a numerical value (for example stored in a table) as an inquiry value, the integrated monitoring unit directs a certain inquiry to the processor, which, dependent thereon, carries out an algorithm allocated to the inquiry value and then communicates the result that results herefrom (for example a binary result in the form of a logical "0" or a logical "1") to the integrated monitoring unit, which on its part compares this result with an internally stored expected value (for example stored in a table); dependent on this comparison, for example after a further processing and/or evaluation of the result, for example in the form of a weighting of the result (for example by means of an error counter) and/or a repetition of the inquiry, the watchdog unit is reset or not reset, whereby the corresponding reactions on the processor and/or the system are initiated or are omitted, i.e. are not carried out.

Advantageously, a system (especially a safety critical system) and the correct carrying-out of the system function can be monitored in a simple and economical manner with the proposed method, without the requirement of an external monitoring unit and therewith of additional hardware or additional development effort and expense or programming effort and expense. Moreover, the communication between the processor and the integrated monitoring unit and the synchronization of the processor and the integrated monitoring unit can be realized in a simple manner and in a manner secure against interference (especially with respect to EMC interferences). Since the watchdog unit is only influenced or acted on by the integrated monitoring unit, a simple watchdog can be provided, especially a simple window watchdog (for example integrated into the integrated circuit).

BRIEF DESCRIPTION OF THE DRAWINGS

The method shall be further explained in connection with the drawing, in which.

DETAILED DESCRIPTION OF AN EXAMPLE EMBODIMENT OF THE INVENTION

Figure 1:
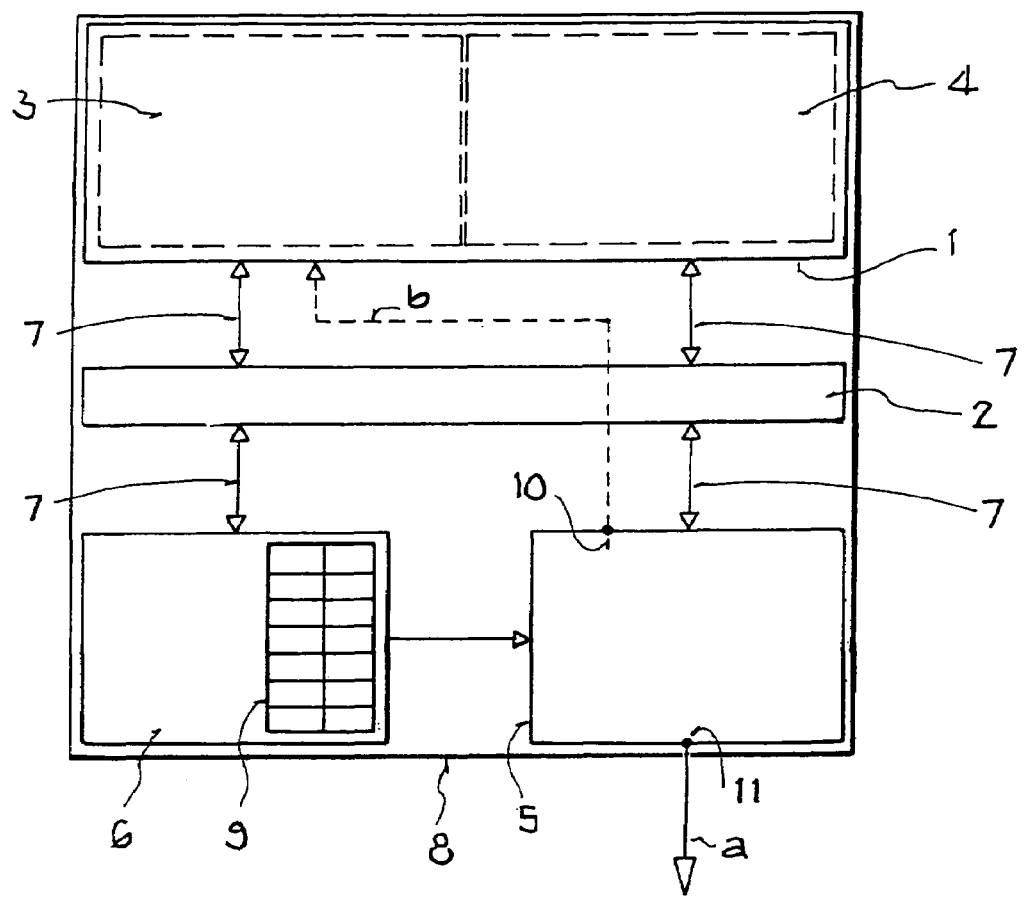
FIG. 1 shows an example embodiment of the components of a processor embodied as a microcontroller, which is implemented in a control device for controlling a safety critical operating function of a motor vehicle.

The microcontroller 1, as a single processor system, is implemented, for example, in a system embodied as a control device for controlling the automatic transmission of a motor vehicle. According to FIG. 1, the microcontroller 1 integrated in the integrated circuit 8 comprises, for example, at least one central processor unit 3 (CPU) and a memory unit 4 as functional units; the functional units of the microcontroller 1 are internally coupled with one another via the bus lines 7 of the bus system 2 for the exchange of data signals and control signals. As an integrated monitoring unit 6, an integrated computing or arithmetic logic unit is integrated in the integrated circuit 8 for monitoring the microcontroller 1, and the integrated computing or arithmetic logic unit is similarly connected to the bus lines 7 of the bus system 2 and, for example, contains a table 9 with numerical values as inquiry values, which correspond to a certain number of algorithms (for example sixteen algorithms), and (for example binary) expected values allocated to the inquiry values or algorithms. Furthermore, a watchdog 5 is provided in the integrated circuit 8, which watchdog is activated by the integrated computing or arithmetic logic unit 6 and comprises a reset output 10 connected with the CPU 3 of the microcontroller 1 as well as a switching output 11 that, for example, drives and controls driver stages of the control device. The watchdog 5, for example embodied as a window watchdog, must be cyclically triggered for monitoring the functionality of the control device, for example, must be triggered by the integrated computing or arithmetic logic unit 6 every 10 ms within a prescribed time interval (within a certain time window of, for example 30 ms).

Figure 2:
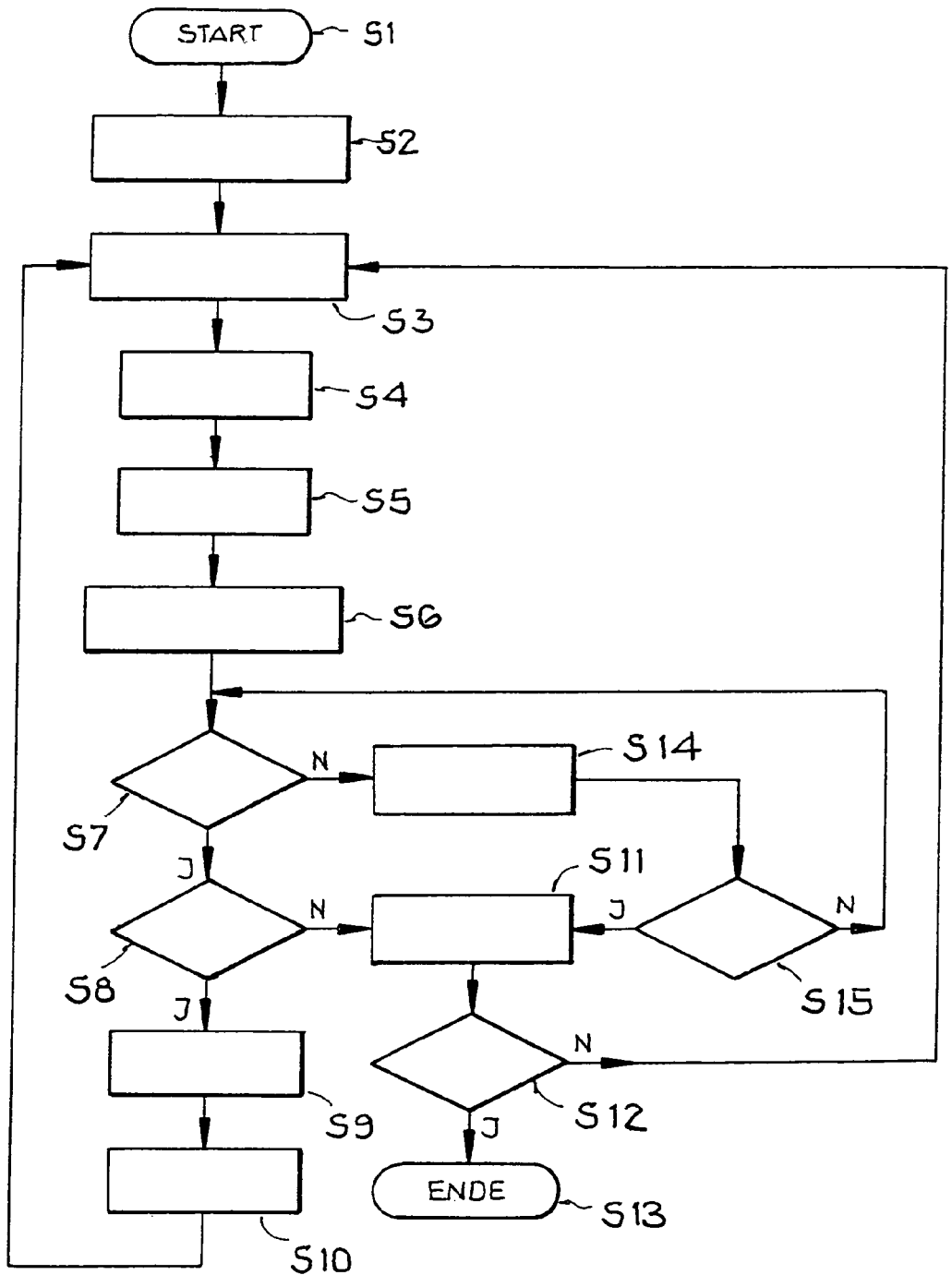
FIG. 2 shows a process sequence or flow diagram for the monitoring routine of the integrated monitoring unit.
Figure 1:
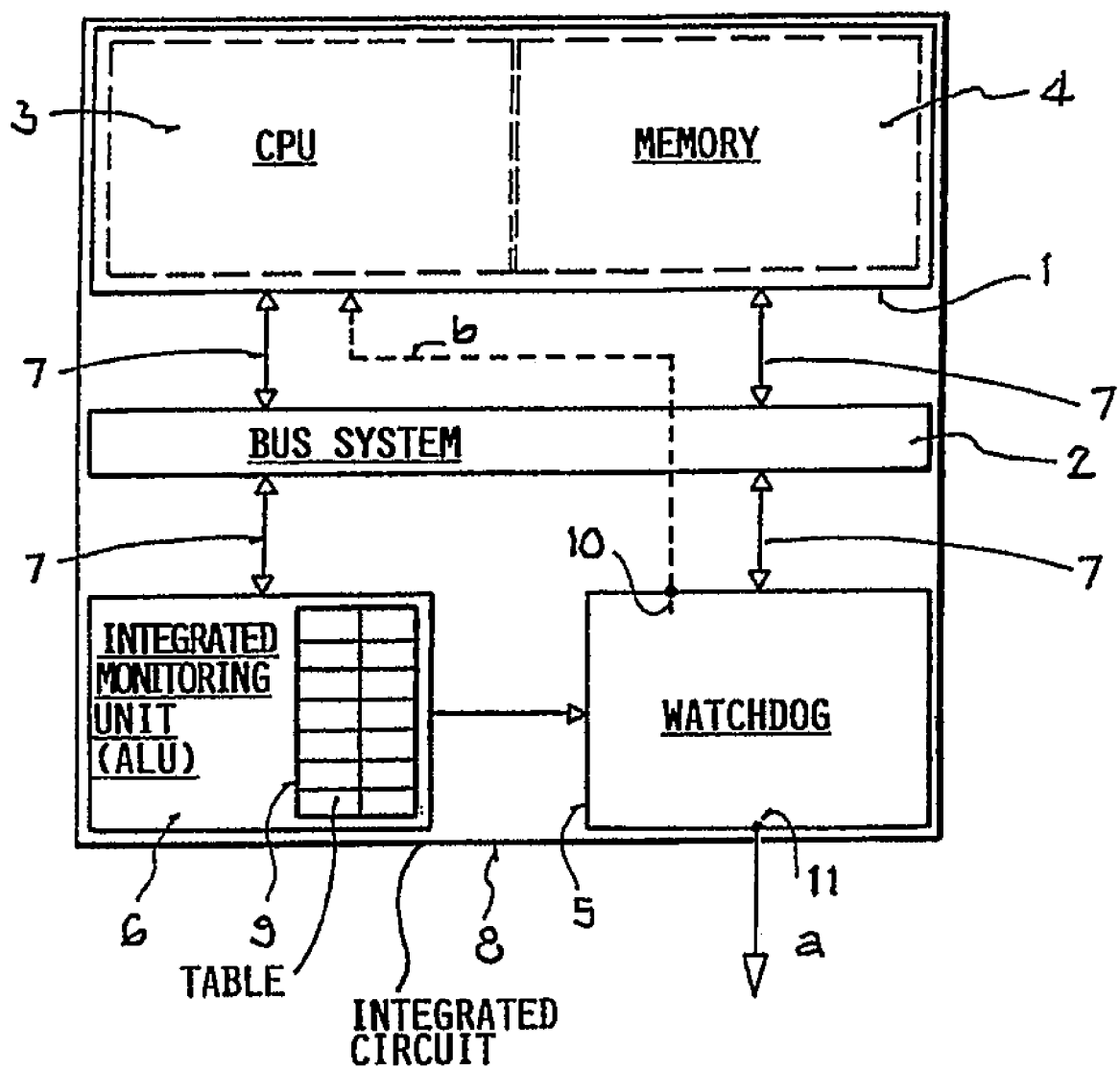
Figure 2:
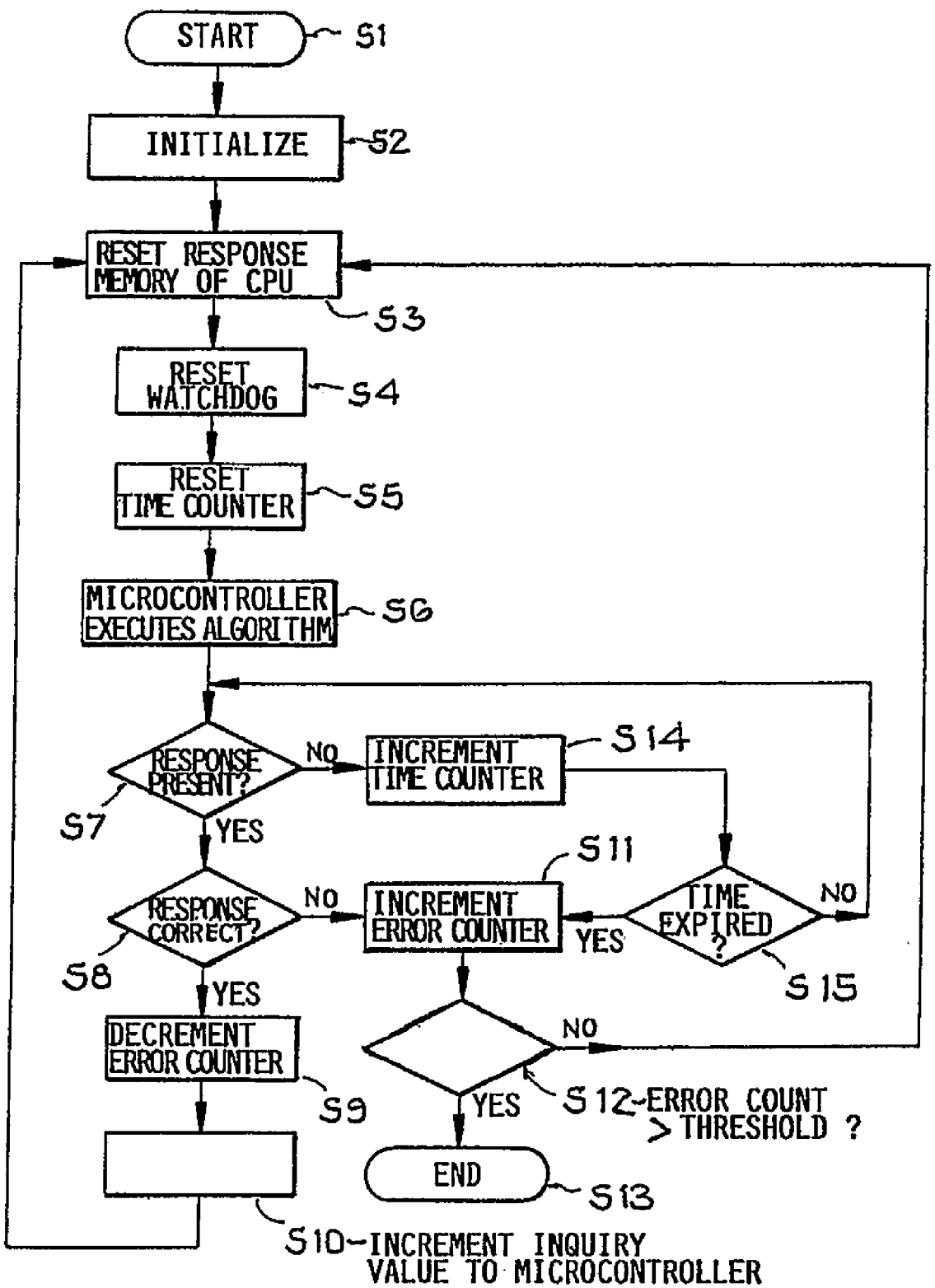

In FIG. 2, the process sequence for monitoring the processor (microcontroller) 1 by the integrated monitoring unit (computing or arithmetic logic unit) 6, with inclusion of the watchdog 5, is illustrated in a process sequence or flow diagram.

After switching on the control device (applying the voltage supply or "power on") in the step S1, the functionality of the integrated computing or arithmetic logic unit 6 is tested in the initialization phase in the step S2, in that all of the inquiry values and therewith the algorithms of the microcontroller 1 allocated to the inquiry values that are contained in the table 9 of the integrated arithmetic logic unit 6 are successively called up and their results are compared with the expected values contained in the table 9 of the integrated arithmetic logic unit 6.

After successful initialization, that is to say especially with a functional integrated arithmetic logic unit 6, the answer or response memory of the CPU 3 of the microcontroller 1 is reset in the step S3, the watchdog 5 is triggered (reset) by the integrated arithmetic logic unit 6 in the step S4, and the time counter of the integrated arithmetic logic unit 6 is reset in the step S5.

In the step S6, by prescribing a certain inquiry value from the integrated arithmetic logic unit 6, the microcontroller 1 is acted on by the carrying-out of the algorithm corresponding to this inquiry value.

In the step S7 it is queried whether an answer or response has occurred on the part of the microcontroller 1, that is to say whether a result (for example a binary code as a result) is present within a certain time interval or a certain time window after the performance or running-through of the prescribed algorithm that has been stored, for example, in a memory unit (for example a RAM) of the microcontroller 1 or of the integrated circuit 8 (for example this algorithm is run-through or executed through the use of defined mathematical and/or algebraic operations) by the microcontroller 1. If this is the case, the response memory of the CPU 3 of the microcontroller 1 is set and the answer or response of the microcontroller 1 is evaluated by the integrated arithmetic logic unit 6 in the step S8, that is to say whether the result (for example the binary code) provided by the microcontroller 1 corresponds to the expected value that is contained in the table 9 of the integrated arithmetic logic unit 6 and that is allocated to the algorithm that has been carried out:

For a correct response of the microcontroller 1 to the inquiry on the part of the integrated arithmetic logic unit 6, an error counter arranged in the integrated arithmetic logic unit 6 is decremented (for example decremented by +1) in the step S9, and a new inquiry is directed to the microcontroller 1 with an inquiry value that is incremented by +1 in the step S10, that is to say, the next subsequent algorithm defined in the table 9 of the integrated arithmetic logic unit 6 must be run-through or executed by the microcontroller 1 and the associated result must be calculated, and so forth. Hereby a constant (cyclical) testing of the functionality of the microcontroller 1 is ensured.

For an incorrect response of the microcontroller 1 to the inquiry on the part of the integrated arithmetic logic unit 6, the error counter of the integrated arithmetic logic unit 6 is incremented (for example incremented by +3) in the step S11; after comparison of the error counter with a prescribed error threshold value in the step S12 (for example this error threshold value amounts to +15), the following is carried out upon falling below the error threshold value, the inquiry on the part of the integrated arithmetic logic unit 6 is repeated to the microcontroller 1 with the same inquiry value (steps S3 to S6)

upon exceeding the error threshold value, especially no new inquiry on the part of the integrated arithmetic logic unit 6 is directed to the microcontroller 1, and also the time counter and the watchdog 5 are not reset; hereby the outputs of the watchdog 5 are correspondingly switched over, especially a (short duration) reset of the CPU 3 of the microcontroller 1 and therewith of the control device is carried out at the reset output 10 (path (b) according to FIG. 1), and the control device is brought into a secure system condition (in this system condition the microcontroller 1 no longer has any influence on the functional operation of the control device) by a corresponding switching signal at the switching output 11 (path (a) according to FIG. 1), for example by switching-off drivers, for example by switching magnetic valves to a currentless condition (end condition of the system in the step S13).

In the step S7, if a response of the microcontroller 1 to an inquiry on the part of the integrated arithmetic logic unit 6 is missing within a time window defined by the time counter (checking or testing of the running-out of the time counter in the step S15 after the prior incrementing of the time counter in the step S14, for example by +1, then the response or answer counts as having been incorrectly answered by the microcontroller 1 (incrementation of the error counter, for example by +3). If the error counter is smaller than the error threshold value (inquiry or interrogation in the step S12), then the inquiry on the part of the integrated arithmetic logic unit 6 must be repeated with the same inquiry value to the microcontroller 1 (steps S3 to S6; if the error counter is larger than the error threshold value (inquiry or interrogation in the step S12), then the outputs 10, 11 of the watchdog 5 are correspondingly switched over (end condition of the system in the step S13).

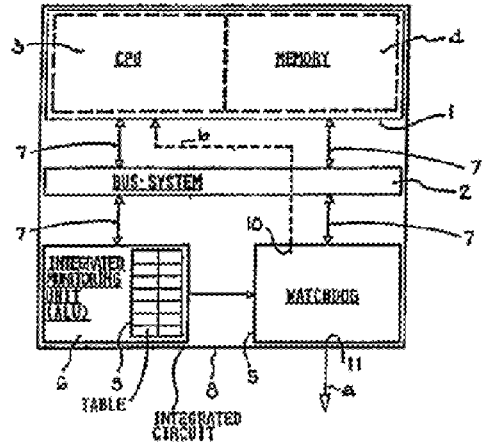

The invention claimed is:

1. Method for operating a system controlled by a processor (1), characterized in that, for monitoring the functional condition of the processor (1) an integrated monitoring unit (6) independent of the processor (1) is integrated together with the processor (1) in an integrated circuit (8), and in that a watchdog unit (5) for preventing measures that influence the system is cyclically reset by the integrated monitoring unit in accordance with an inquiry directed from the integrated monitoring unit to the processor.

2. Method according to claim 1, characterized in that the integrated monitoring unit (6) is tested during the initialization of the system by the processor (1).

3. Method according to claim 1, characterized in that the functional condition of the processor (1) is monitored by the integrated monitoring unit (6) until the integrated monitoring unit is switched off.

4. Method according to claim 3, characterized in that the integrated monitoring unit (6) can be switched off by the processor (1).

5. Method according to claim 1, characterized in that the integrated monitoring unit (6) is connected with the functional units (3, 4) of the processor (1) via a bus system (2).

6. Method according to claim 1, characterized in that the watchdog unit (5) must be reset within a time window by the integrated monitoring unit (6).

7. Method according to claim 1, characterized in that the watchdog unit (5) is integrated in the integrated circuit (8).

8. Method according to claim 1, characterized in that the inquiry to the processor (1) is carried out via an inquiry value prescribed by the integrated monitoring unit (6), according to which a certain algorithm is executed in the processor (1), the result of which is compared with an expected value of the integrated monitoring unit (6).

9. Method according to claim 1, characterized in that a resetting of the processor (1) is carried out upon the absence of a resetting of the watchdog unit (5).

10. Method according to claim 1, characterized in that the system is brought into a system condition independent of the processor (1) upon the absence of a resetting of the watchdog unit (5).

* * * * *

UNITED STATES PATENT AND TRADEMARK OFFICE
CERTIFICATE OF CORRECTION

PATENT NO. : 7,174,483 B2
APPLICATION NO. : 10/398544
DATED : February 6, 2007
INVENTOR(S) : Becher et al.

It is certified that error appears in the above-identified patent and that said Letters Patent is hereby corrected as shown below:

Delete Title page illustrating a figure, and substitute therefor, new Title page illustrating a figure. (attached)

Delete drawing sheet 1-2, and substitute therefor drawing sheet 1-2. (attached)

Signed and Sealed this

Third Day of July, 2007

JON W. DUDAS
*Director of the United States Patent and Trademark Office*

United States Patent
Becher et al.

(10) Patent No.: US 7,174,483 B2
(45) Date of Patent: Feb. 6, 2007

(54) METHOD FOR OPERATING A PROCESSOR-CONTROLLED SYSTEM

(75) Inventors: Alwin Becher, Fuerth (DE); Peter Bertelshofer, Zirndorf (DE); Roger Pohlmann, Nuremberg (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 641 days.

(21) Appl. No.: 10/398,544

(22) PCT Filed: Oct. 2, 2001

(86) PCT No.: PCT/EP01/11365

§ 371 (c)(1),
(2), (4) Date: Apr. 7, 2003

(87) PCT Pub. No.: WO02/33549

PCT Pub. Date: Apr. 25, 2002

(65) Prior Publication Data
US 2004/0078731 A1  Apr. 22, 2004

(30) Foreign Application Priority Data
Oct. 6, 2000  (DE) .............. 100 49 441

(51) Int. Cl.
G06F 11/00 (2006.01)
(52) U.S. Cl. .............. 714/55; 714/23; 714/30; 714/51
(58) Field of Classification Search .............. 714/23, 714/30, 51, 55
See application file for complete search history.

(56) References Cited

U.S. PATENT DOCUMENTS

| | | | |
|---|---|---|---|
| 4,488,303 A | | 12/1984 | Abramovich |
| 4,956,807 A | | 9/1990 | Hoseka et al. |
| 5,233,613 A | * | 8/1993 | Allen et al. .............. 714/55 |
| 5,327,362 A | * | 7/1994 | Nomura .............. 714/55 |
| 5,440,725 A | * | 8/1995 | Weller et al. .............. 714/55 |
| 6,076,172 A | | 6/2000 | Kimura et al. |
| 6,243,837 B1 | * | 6/2001 | Zimmermann et al. .............. 714/55 |
| 6,393,589 B1 | * | 5/2002 | Smit et al. .............. 714/55 |
| 6,490,699 B2 | * | 12/2002 | Nishibe et al. .............. 714/55 |

FOREIGN PATENT DOCUMENTS

DE  3345863  7/1984

OTHER PUBLICATIONS

M. Namjoo, "Techniques For Concurrent Testing of VLSI Processor Operation"; Center For Reliable Computing, Departments of Electrical Engineering and Computer Science, Stanford University, Stanford, CA,; 1982 IEEE TEST Conference (Nov. 1982); Paper 16.2, pp. 461 to 468.

* cited by examiner

Primary Examiner—Robert Beausoliel
Assistant Examiner—Joseph D. Manoskey
(74) Attorney, Agent, or Firm—W. F. Fasse; W. G. Fasse

(57) ABSTRACT

A method for monitoring a system controlled by a processor utilizes an integrated monitoring unit independent of the processor but integrated together with the processor in an integrated circuit, as well as a watchdog unit for preventing measures that influence the system. The watchdog unit is cyclically reset by the integrated monitoring unit.

10 Claims, 2 Drawing Sheets